US006331830B1

(12) United States Patent
Song et al.

(10) Patent No.: US 6,331,830 B1
(45) Date of Patent: Dec. 18, 2001

(54) SELF-TRIMMING CURRENT SOURCE AND METHOD FOR SWITCHED CURRENT SOURCE DAC

(75) Inventors: Bang-Sup Song, LaJolla, CA (US); Alex R. Bugeja, Dallas, TX (US)

(73) Assignee: Rockwell Technologies LLC, Thousand Oaks, CA (US)

(*) Notice: Subject to any disclaimer, the term of this patent is extended or adjusted under 35 U.S.C. 154(b) by 0 days.

(21) Appl. No.: 09/631,596

(22) Filed: Aug. 3, 2000

Related U.S. Application Data

(60) Provisional application No. 60/180,434, filed on Feb. 4, 2000.

(51) Int. Cl.[7] ..................................................... H03M 1/10

(52) U.S. Cl. .......................... 341/121; 341/118; 341/120; 341/136

(58) Field of Search .................................... 341/118, 120, 341/121, 136

(56) References Cited

U.S. PATENT DOCUMENTS 4,272,760 * 6/1981 Prazak et al. ........................ 341/121
4,568,917 * 2/1986 McKenzie et al. .................. 341/120
5,153,592 * 10/1992 Fairchild et al. .................... 341/118
5,666,118 * 9/1997 Gersbach ............................. 341/120

OTHER PUBLICATIONS

IEEE Journal Of Solid–State Circuits, *A Self–Calibration Technique for Monolithic High–Resolution D/A Converters*, D. Wouter J. Groeneveld, Hans J. Schouwenaars, et al. vol. 24, No. 6, p. 1517–1522 (12–89).

* cited by examiner

*Primary Examiner*—Michael Tokar
*Assistant Examiner*—Lam T. Mai
(74) *Attorney, Agent, or Firm*—Koppel & Jacobs

(57) ABSTRACT

A self-trimming current source for used in a switched current source DAC is made from a fixed current source and a variable current source, which are connected in parallel to provide a total output current. The total output current is automatically calibrated by temporarily switching one side of the self-trimming current source to a measurement circuit. Based on the measured value, the variable current source is adjusted to make the total output current equal to a predetermined value. The fixed current source is implemented with a complementary pair of field-effect transistors (FETs) connected in a cascode connection, with the two drain terminals presenting high impedances to the circuitry to which they are connected. A DAC typically includes a plurality of self-trimming current sources, each of which is calibrated during each DAC conversion cycle.

34 Claims, 6 Drawing Sheets

SELF-TRIMMING CURRENT SOURCE AND METHOD FOR SWITCHED CURRENT SOURCE DAC

This application claims the benefit of provisional patent application number 60/180,434 to Song et al., filed Feb. 4, 2000.

BACKGROUND OF THE INVENTION

1. Field of the Invention

This invention relates to the field of digital-to-analog converters (DACs), and particularly to circuits and methods for automatically calibrating the current sources making up a switched current source DAC.

2. Description of the Related Art

Demand for high speed/high resolution DACs continues to grow, driven primarily by strong growth in the markets for wired and wireless communications. One architecture which has been used to construct high speed/high resolution DACs employs an array of current sources: the DAC receives a digital input word which represents a desired output current, and the current sources are selectively switched to an output to provide the desired output current. Such "switched current source" DACs have been favored for high speed and high resolution applications due to their ability to drive a resistive load directly, without the need for a voltage buffer.

One problem which afflicts switched current source DACs is current source mismatch. A typical switched current source DAC employs a segmented current source design, with the DAC's most significant bits (MSBs), upper least significant bits (ULSBs), and lower least significant bits (LLSBs) implemented with respective current source subarrays, with the current sources in a given subarray ideally producing identical output currents. Mismatch between the current sources in a given subarray, particularly if within the MSB subarray, degrades the DAC's static linearity, which in turn degrades its dynamic linearity.

Some method of static calibration is typically employed to reduce mismatch between current sources. Traditionally, as discussed, for example, in D. Groeneveld et al., "A Self-Calibration Technique for Monolithic High-Resolution D/A Converters,", IEEE Journal of Solid-State Circuits, vol. 24, pp. 1517–1522, December 1989, this has been accomplished by using an additional current source within a subarray, which allows one current source to be taken out of the circuit at any one time for calibration measurement and/or correction purposes, leaving a full bank of current sources available for normal DAC operation.

The requirement for an additional current source, however, can impact the DAC's dynamic performance, since the switching in and out of current sources at the calibration rate introduces spurs at the calibration frequencies in the DAC output spectrum. In practice, these spurs include additional dynamic components from dynamic mismatches between the current source arrays being used at any one time. These dynamic mismatches are not attenuated by the calibration mechanism, and can, in fact, be increased by mismatches in the switches needed to facilitate the calibration.

SUMMARY OF THE INVENTION

A self-trimming current source circuit and method are presented for use with switched current source DACs, which improve the static and dynamic linearity of such DACs without requiring the use of any additional current sources.

Each self-trimming current source is made from a fixed current source and a variable current source, which are connected in parallel to provide a total output current. To calibrate, one side of the self-trimming current source is temporarily switched to a measurement circuit, which determines the magnitude of the total output current. Based on this measurement, the output of the variable current source is adjusted to make the total output current equal to a predetermined value (within a predetermined tolerance determined by the accuracy and resolution of the measurement and correction circuits).

The fixed current source is implemented with a complementary pair of field-effect transistors (FETs) connected in a cascode connection, with the two source terminals connected together and the two drain terminals presenting high impedances to the circuitry to which they are connected. The top FET establishes the bottom FET's gate-source voltage, thereby fixing the current through the pair. The self-trimming current source's output current is taken at the top FET's drain terminal and is measured via the bottom FET's drain, with the high impedances provided by the specified cascode configuration enabling reduced output current distortion and a nearly-constant total output current.

The variable current source is connected in parallel with the fixed current source, and provides an output current that varies with a control signal received at an input. The output currents of the fixed and variable current sources are summed to provide a total output current, which is periodically measured via the bottom FET's drain terminal. Based on the measurement value, the control signal provided to the variable current source is varied as necessary to make the total output current equal to the predetermined value.

A typical switched current source DAC contains a number of such self-trimming current sources, with the total output currents of each automatically measured and adjusted once for every one of the DAC's conversion cycles. The invention is applicable to both single-ended and differential output DACs.

Further features and advantages of the invention will be apparent to those skilled in the art from the following detailed description, taken together with the accompanying drawings.

DETAILED DESCRIPTION OF THE INVENTION

Figure 1:
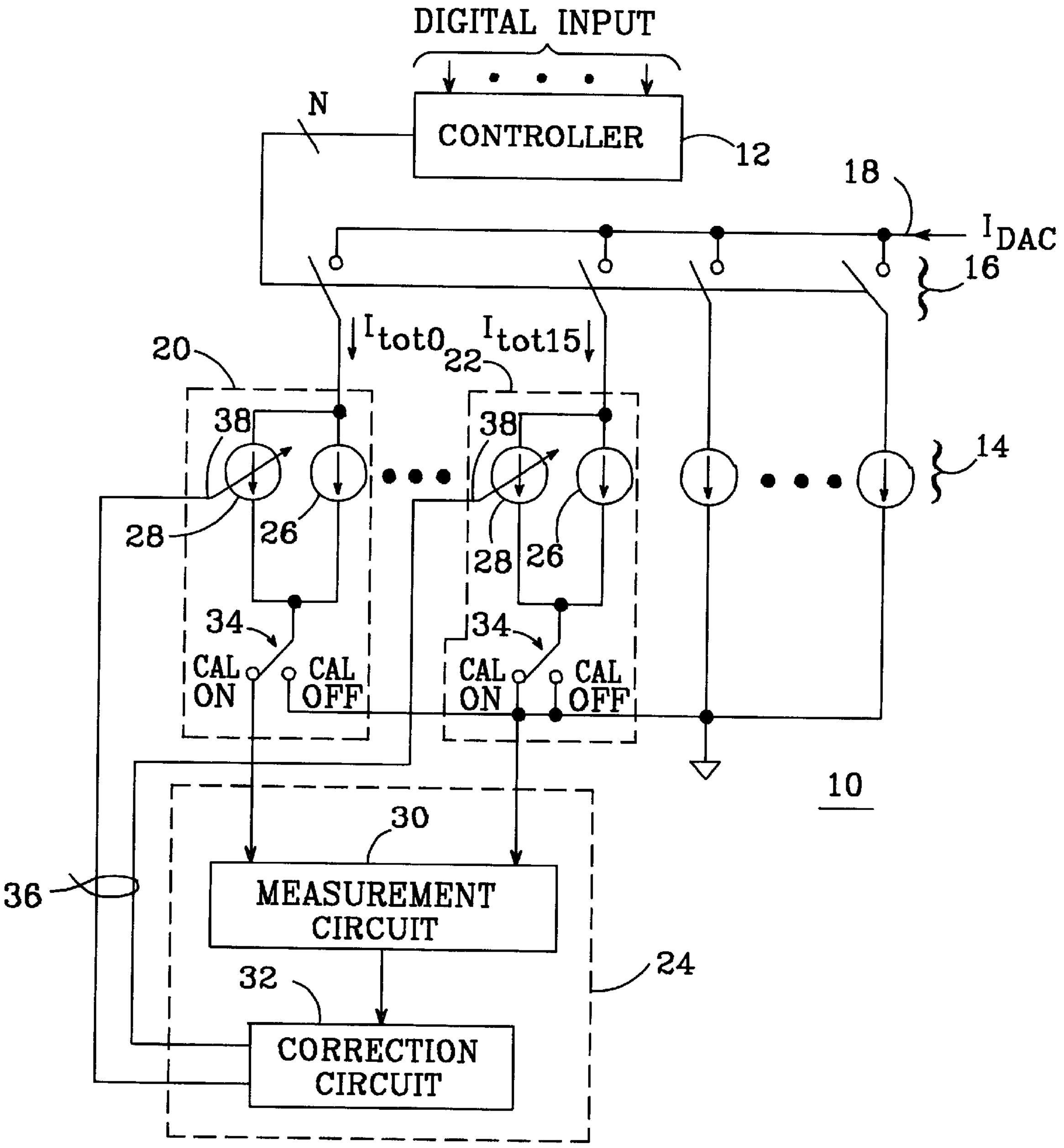
FIG. 1 is a block diagram illustrating the basic principles of the invention.

FIG. 1 illustrates the basic principles of the invention. A switched current source DAC 10 includes a controller 12 which receives a digital input word representative of a desired output current. An array of N current sources 14 have their outputs connected to respective switches 16. Corresponding terminals on each switch are connected together to form an output line 18. During a "conversion cycle", the controller 12 closes switches 16 as necessary to convert the digital input word to the desired output current $I_{DAC}$.

To reduce the problems associated with current source mismatch described above, at least some of the current sources 14 are made self-trimming. Two such self-trimming current sources 20 and 22 are shown in FIG. 1, each of which requires the use of associated circuitry 24 to self-trim. All of the DAC's current sources could be made self-trimming, but as the lower-order bits are typically held to a lower accuracy specification, it is typically not necessary to do so. The MSB current sources typically are made self-trimming, however, as mismatches between these current sources result in the greatest distortion.

Each self-trimming current source includes a fixed current source 26 and a variable current source 28 connected in parallel, the individual output currents of which are summed together to provide a "total" output current, such as $I_{tot0}$ from source 20 and $I_{tot15}$ from source 22. The total output currents are connected to output line 18 as required by controller 12 to provide DAC output current $I_{DAC}$.

Associated circuitry 24 includes a measurement circuit 30 and a correction circuit 32. Each self-trimming current source is connected at one end to a respective switch 34, which connects it to measurement circuit 30 when in a CAL ON position, and to a circuit common point (typically ground) otherwise (CAL OFF). In operation, one of switches 34 is placed in its CAL ON position (with all others in CAL OFF), and the total output current of the self-trimming current source connected to that switch is measured. The measured value is passed onto correction circuit 32. Each variable current source 28 is arranged to produce an output current that varies with a control signal 36 received at an input 38. Correction circuit 32 is arranged to provide the control signals 36 to the appropriate variable current source inputs needed to make the total output current of each self-trimming current source equal to a predetermined value (within a predetermined tolerance determined by the accuracy and resolution of the measurement and correction circuits). Each of the self-trimming current sources is calibrated in this way, thereby reducing the mismatch between them and improving the DAC's distortion performance.

Figure 2:
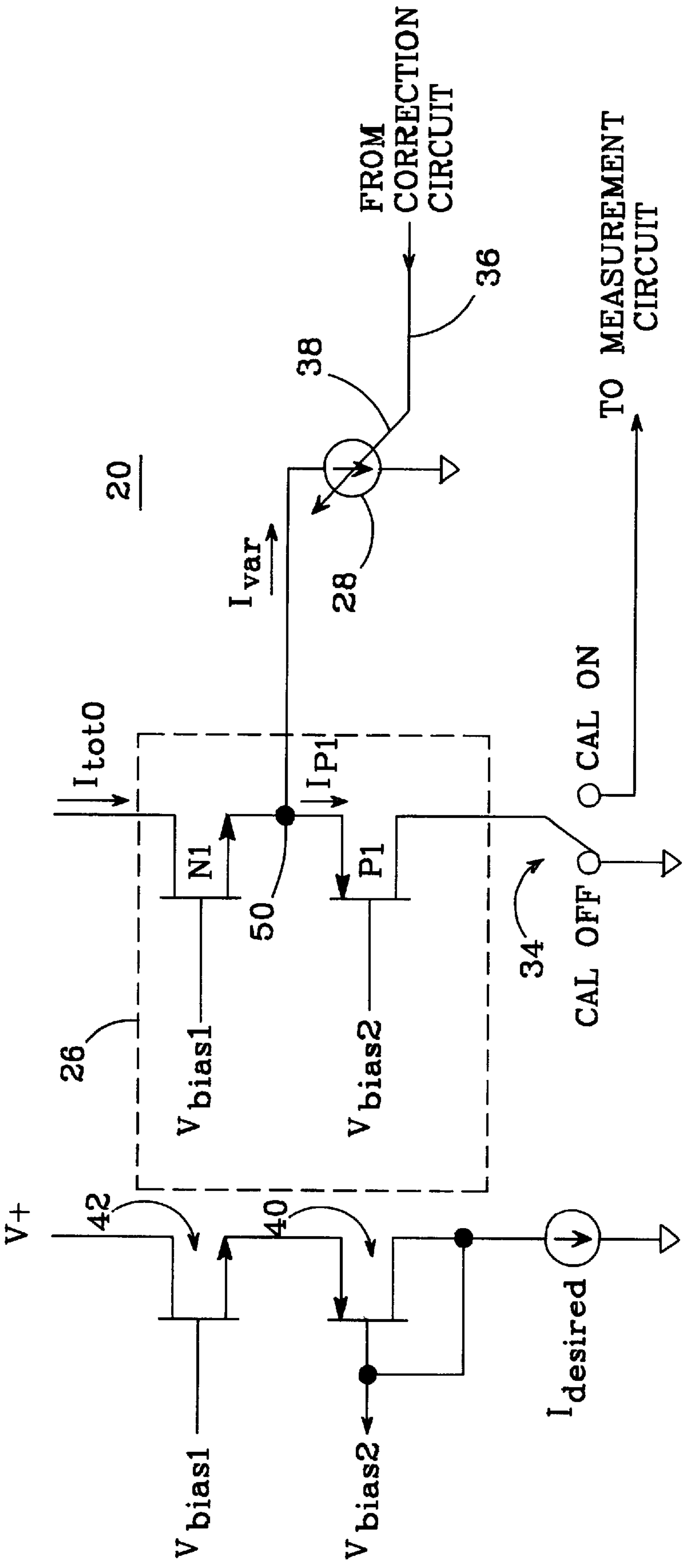
FIG. 2 is a schematic diagram of a self-trimming current source per the present invention.

An exemplary implementation of a self-trimming current source such as source 20 is shown in FIG. 2. Fixed current source 26 is made from a complementary pair of FETs N1 and P1 connected in a cascode configuration. N1's gate is connected to a bias voltage $V_{bias1}$, and its drain provides the self-trimming current source's output current $I_{tot0}$. P1's gate is connected to a bias voltage $V_{bias2}$, its source is connected to N1's source at a junction 50, and its drain is connected to switch 34. In operation, $V_{bias1}$ and $V_{bias2}$ are selected to saturate N1 and P1, which results in a known voltage at the source of P1. This fixes P1's gate-source voltage ($V_{gs}$), which, along with the size of P1, establishes the current ($I_{P1}$) through P1. Current $I_{P1}$ is the contribution of fixed current source 26 to $I_{tot0}$.

Self-trimming current source 20 also includes variable current source 28. Variable current source 28 is connected between junction 50 and circuit common, and receives control signal 36 from correction circuit 32 at input 38. Variable current source 28 sinks an output current $I_{var}$ in response to control signal 36. Currents $I_{var}$ and $I_{P1}$ are summed at junction 50 to produce total output current $I_{tot0}$.

P1's drain is connected to switch 34, which is placed in its CAL ON position to connect self-trimming current source 20 to measurement circuit 30 and thereby enable $I_{tot0}$ to be measured. In operation, $I_{tot0}$ is measured by measurement circuit 30. The measurement is provided to correction circuit 32, which provides the control signal 36 to variable current source 28 necessary to bring $I_{tot0}$ to the predetermined value.

It is essential to the proper operation of the self-trimming current source that fixed current source FETs N1 and P1 be configured as shown; i.e., with their sources connected together and their drains available for connection to other circuitry. When so configured, the drain of P1 presents a high impedance to measurement circuit 30, which reduces the difference in total output current that might otherwise be present as the current source switches between its measurement and normal operating modes. Similarly, the drain of N1 presents a high impedance to the load driven by the DAC, thereby improving the DAC's distortion performance. Note that while FIG. 2 depicts N1 as an n-channel FET and P1 as a p-channel FET, fixed current source 26 can also be implemented with transistors of the opposite polarity and still retain its essential high impedance characteristics. This opposite polarity implementation is discussed below in conjunction with FIG. 3*c*.

To keep current source mismatch as low as possible, the self-trimming current sources are preferably arranged to trim their respective output currents once per conversion cycle. As discussed in more detail below, this is preferably accomplished by closing each of switches 34 in turn during each conversion cycle, measuring each source's total output current while its respective switch is closed, and storing the measurement result. The stored results are then used by the correction circuit to adjust the control signals provided to each self-trimming current source.

One possible circuit for providing bias voltage $V_{bias2}$ is shown in FIG. 2. The desired full-scale current $I_{desired}$ is passed through a two-transistor stack made up of a diode-connected PMOS device 40 and a common drain NMOS device 42. $V_{bias1}$ is applied to the gate of transistor 42 to set $V_{bias2}$ equal to $V_{bias1}$ minus the sum of the gate-source voltages of transistors 40 and 42. PMOS transistor 40 and NMOS transistor 42 are matched to P1 and N1, respectively, so that they carry the desired full-scale current when $V_{bias2}$ and $V_{bias1}$ are applied to them.

Figure 3A:
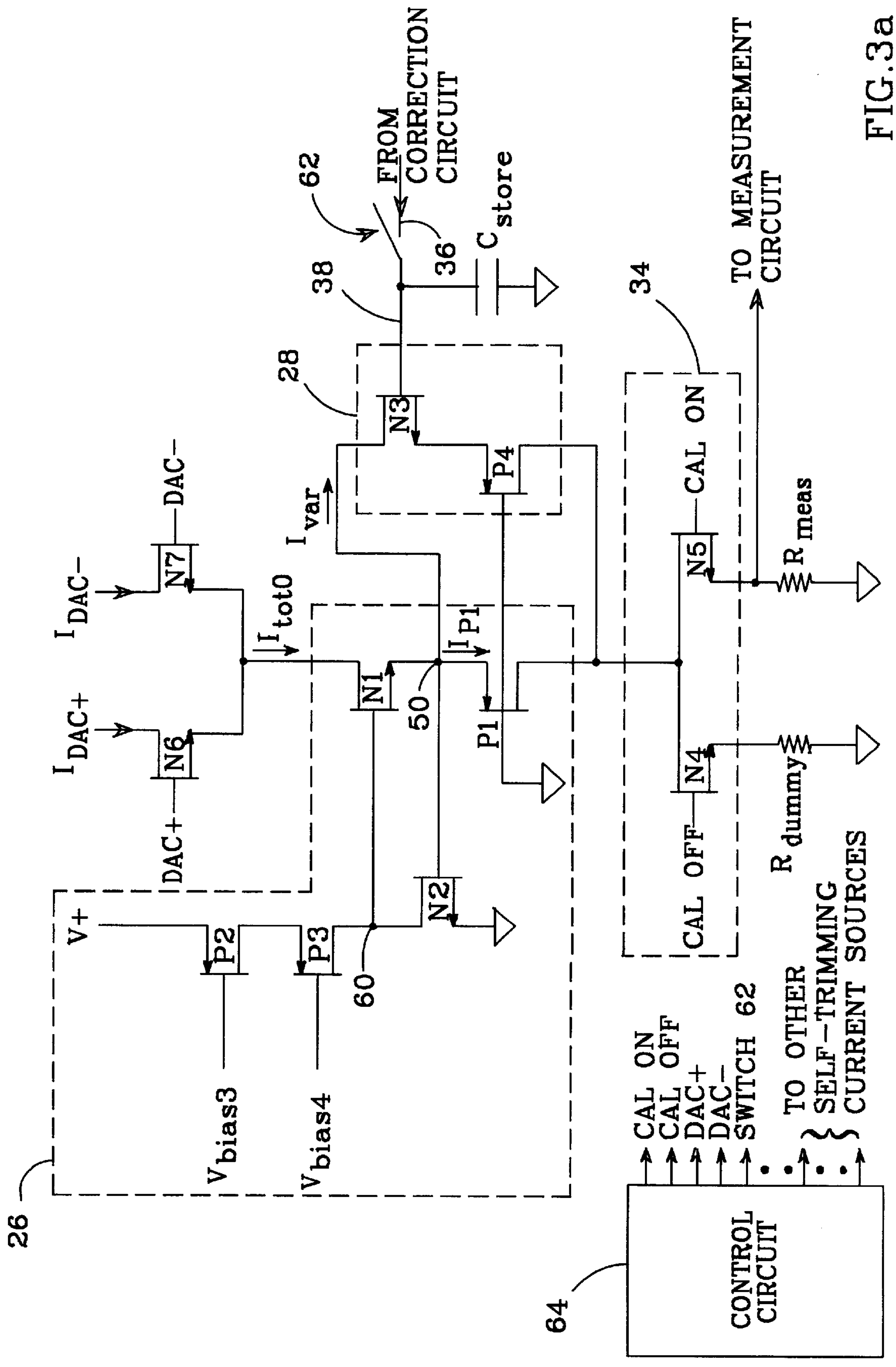
FIG. 3*a* is a schematic diagram of a preferred self-trimming current source.

A preferred implementation of a self-trimming current source per the present invention is shown in FIG. 3*a*. FETs N1 and P1 are as in FIG. 2, but instead of N1 receiving a fixed bias voltage to establish $I_{P1}$, a bias circuit which uses a feedback circuit sets P1's source voltage. In addition, P1's gate voltage $V_{bias2}$ is set to zero volts by connecting its gate to circuit common. The exemplary bias circuit implementation shown includes a pair of p-channel FETs P2 and P3 connected in series between a positive supply voltage V+ and a junction 60, with P2 receiving a bias voltage $V_{bias3}$ and P3 receiving a bias voltage $V_{bias4}$ at their respective gates. An n-channel FET N2 is connected between junction 60 and circuit common, with its gate connected to junction 50. Junction 60 is connected to N1's gate. The feedback loop comprising N1 and N2 keep the source voltage of P1 constant at the gate-source voltage of N2, thereby establishing a fixed value for $I_{P1}$. The use of a feedback circuit such as that shown in FIG. 3*a* to establish P1's source voltage is preferred, because it boosts the resistance of the self-trimming current source and holds P1's source voltage nearly constant.

Figure 3B:
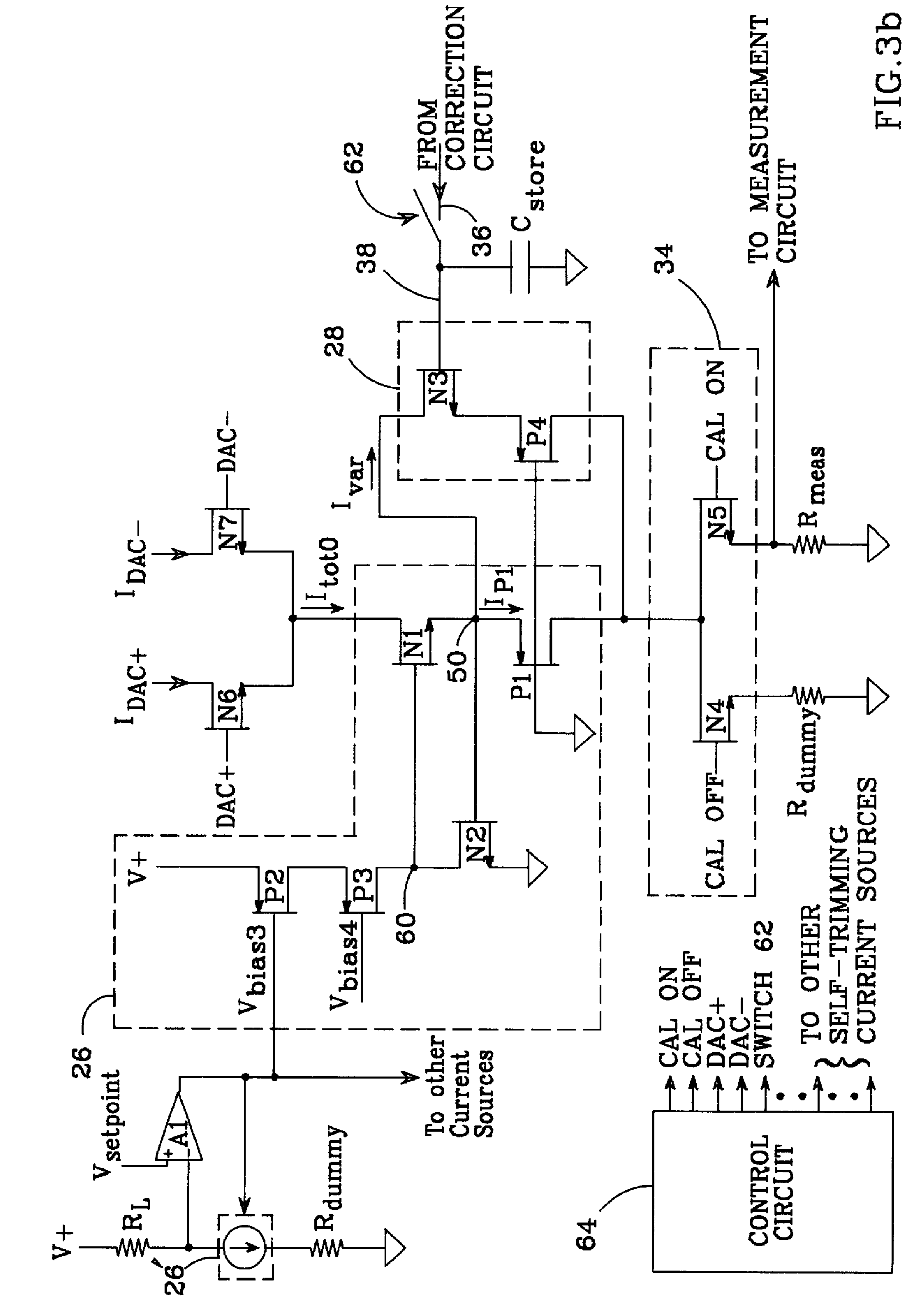
FIG. 3*b* is a schematic diagram of the self-trimming current source of FIG. 3*a* with a circuit for generating bias voltage $V_{bias3}$.

As shown in FIG. 3*b*, a control loop can be set up to generate bias voltage $V_{bias3}$ and thereby control the value of $I_{P1}$. A dummy current source 26' identical to self-trimming current source 26 is connected to V+ via a load resistor $R_L$, which carries the current sunk by current source 26. The load current is monitored with an amplifier A1, which also receives a setpoint voltage $V_{setpoint}$. The output of A1 is connected to the $V_{bias3}$ input of dummy current source 26 to form a servo loop which keeps the value of $V_{bias3}$ constant; A1's output is then used to provide $V_{bias3}$ 3 to all self-trimming current sources 26. This arrangement provides a means of controlling the DAC's full-scale current ($V_{setpoint}$= V+−(desired full-scale current×$R_L$), and enables variations in process, temperature, and matching between N2 and P1 to be reduced.

Variable current source 28 is preferably implemented with a complementary pair of FETs N3 and P4. N3 and P4 are connected across P1, with N3's drain connected to P1's source and providing the variable current source's output current $I_{var}$, N3's source connected to P4's source, and P4's drain connected to P1's drain. N3's gate is the input 38 of variable current source 28, and P4's gate is connected to P1's gate.

N3 is operated in linear mode, behaving as a voltage-controlled resistor in P4's source lead. The resistance of N3 varies with the signal applied to input 38, causing the current through P4, and thus the variable current source's output current $I_{var}$, to vary with the incoming signal.

Control signal 36 from correction circuit 32 can be directly connected to input 38; this requires the control signal to be present throughout each conversion cycle, which requires the use of respective control signal sources for each self-trimming current source. Preferably, however, the control signals provided by correction circuit 32 are time-multiplexed from a single source to the DAC's self-trimming current sources, and stored locally. To facilitate this, a capacitor $C_{store}$ is connected between the variable current source input 38 and circuit common, and a switch 62 is interposed between input 38 and correction circuit 32. When the control signal 36 appropriate for a given self-trimming current source becomes available, switch 62 closes and the control signal's voltage is transferred onto $C_{store}$. Switch 62 is then opened, the switch for a different self-trimming current source is closed, and the control signal appropriate for that source is transferred to its storage capacitor. Storing the control signal voltage on $C_{store}$ enables variable current source 28 to continuously provide the current $I_{var}$ needed to obtain the desired $I_{tot0}$ value, even if control signal 36 is only briefly available.

Switch 34 is preferably implemented with a pair of switching transistors N4 and N5, having their drains connected to the drain of P1 and their gates connected to complementary control signals CAL OFF and CAL ON, respectively. The source of N5 is connected to measurement circuit 30, so that when N5 is on (CAL ON=1), it provides a conductive path between the drain of P1 and the measurement circuit, enabling the self-trimming current source's total output current to be determined. A measurement resistor $R_{meas}$ is preferably connected between N5's source and circuit common, such that when N5 is on, a voltage develops across $R_{meas}$ which is proportional to $I_{tot0}$; this voltage is measured by measurement circuit 30 to determine $I_{tot0}$.

A resistor $R_{dummy}$ is preferably connected between the source of N4 and circuit common. The resistance of $R_{dummy}$ is preferably made equal to that of $R_{meas}$ (within a known tolerance determined by the resistors' fabrication method), to avoid there being a large difference in P1's drain-source voltage—and thereby a difference in total output current $I_{tot0}$—between the self-trimming current source's calibration (CAL ON=1) and normal (CAL OFF=1) modes.

Note that the self-trimming current source of FIG. 3*a* is typically replicated repeatedly in the design of a switched current source DAC. In such an application, each self-trimming current source typically has its own dummy resistor $R_{dummy}$. However, the sources of the respective N5 transistors are preferably all connected to one side of a single measurement resistor $R_{meas}$. The self-trimming current sources may then be multiplexed to the measurement resistor and the measurement circuit, ensuring consistent measurements between sources.

The invention is equally applicable with single-ended and differential output DACs. As shown in FIG. 2, the drain of N1 provides a single-ended output. For a differential output DAC, a pair of transistors N6 and N7 are used to switch the drain of N1 to a positive ($I_{DAC+}$) or a negative ($I_{DAC-}$) output line, in response to a pair of control signals DAC+ and DAC−, respectively.

One or more control circuits 64 are preferably employed to provide the switching signals required for the proper operation of the self-trimming current source, such as the CAL ON/CAL OFF signals, the DAC+/DAC− signals, and a signal which controls switch 62. When a DAC contains more than one self-trimming current source, control circuits 64 must provide respective sets of switching signals for each source. Control circuits 64 must also control the timing of the switching signals, ensuring, for example, that only one self-trimming current source is switched to the measurement circuit at any one time. As the operation of control circuits 64 is coordinated with the DAC's conversion cycles (so that the self-trimming current sources are calibrated once per cycle), control circuits 64 are preferably incorporated as part of DAC controller 12.

Figure 3C:
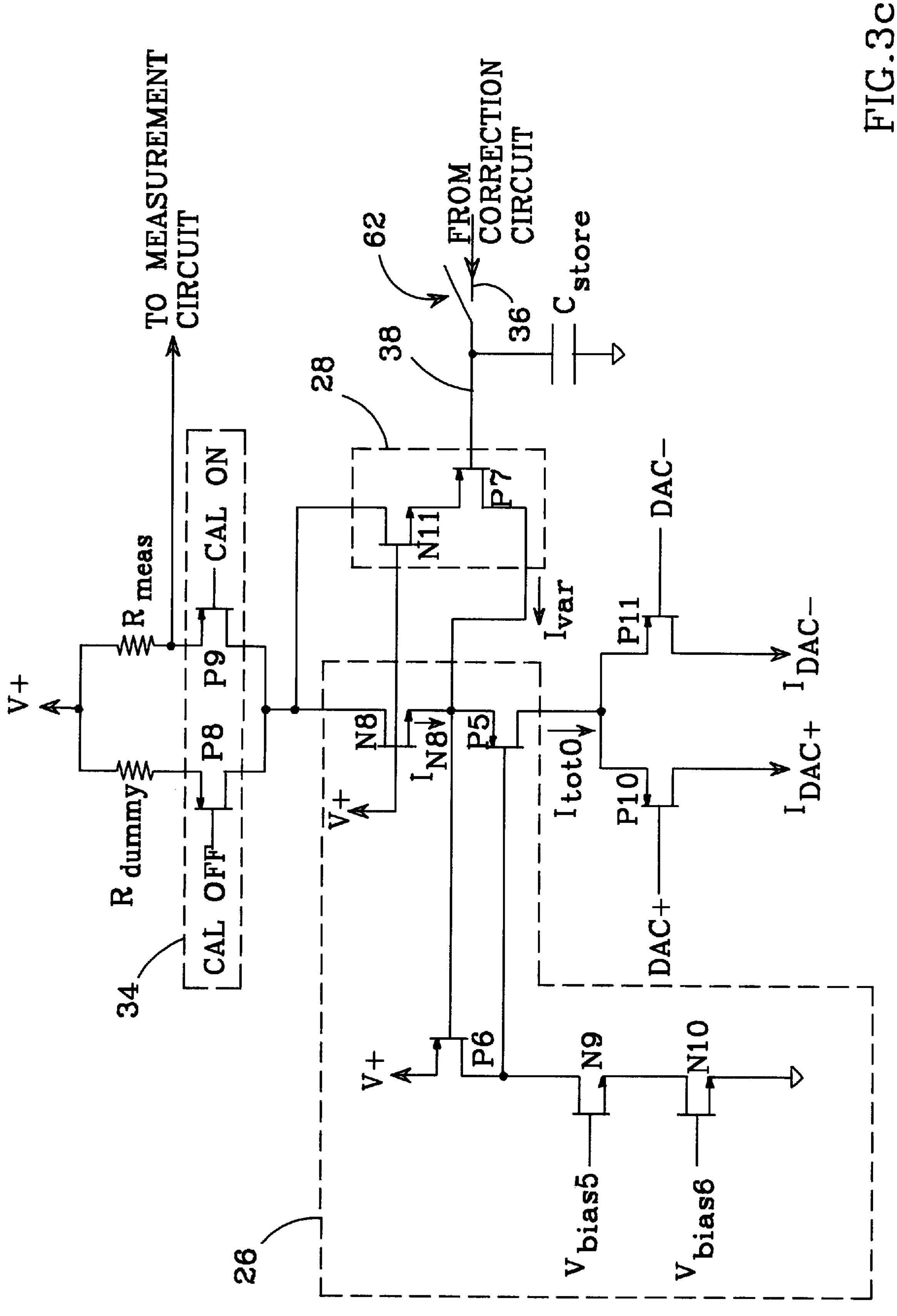
FIG. 3*c* is a schematic diagram of an opposite polarity embodiment of the self-trimming current source of FIG. 3*a*.

An "opposite polarity" embodiment of the self-trimming current source of FIG. 3*a* is shown in FIG. 3*c*, in which FIG. 3*a*'s n-channel and p-channel devices are replaced with p-channel and n-channel devices, respectively. Here, fixed current source 26 is made from a transistor P5 which establishes the gate-source voltage of a transistor N8 to generate an output current $I_{N8}$, along with a bias circuit made from a p-channel device P6 and two n-channel devices N9 and N10 receiving respective bias voltage $V_{bias5}$ and $V_{bias6}$. Variable current source 28 includes a transistor P7 which receives input 38 and modulates the current through a transistor N11 in response to produce its output current $I_{var}$. $I_{var}$ and $I_{N8}$ are summed together to produce the self-trimming current source's total output current $I_{tot0}$. A pair of transistors P8 and P9 connect the current source to $R_{dummy}$ and $R_{meas}$, respectively, and a pair of transistors P10 and P11 connect $I_{tot0}$ to positive or negative output lines in accordance with control signals DAC+ and DAC−. The resulting self-trimming current source sources current to the DAC output, in contrast to the FIG. 3*a* embodiment which sinks current from the output.

Note that the specific circuit implementations shown in FIGS. 3*a*, 3*b* and 3*c* are merely exemplary; many other circuit arrangements could be used to, for example, establish the current through fixed current source transistors N1/P1 and N8/P5, provide the switching function of switch 34, or implement variable current source 28. Also, though the self-trimming current source is shown implemented with FETs, bipolar transistors could also be used.

Figure 4:
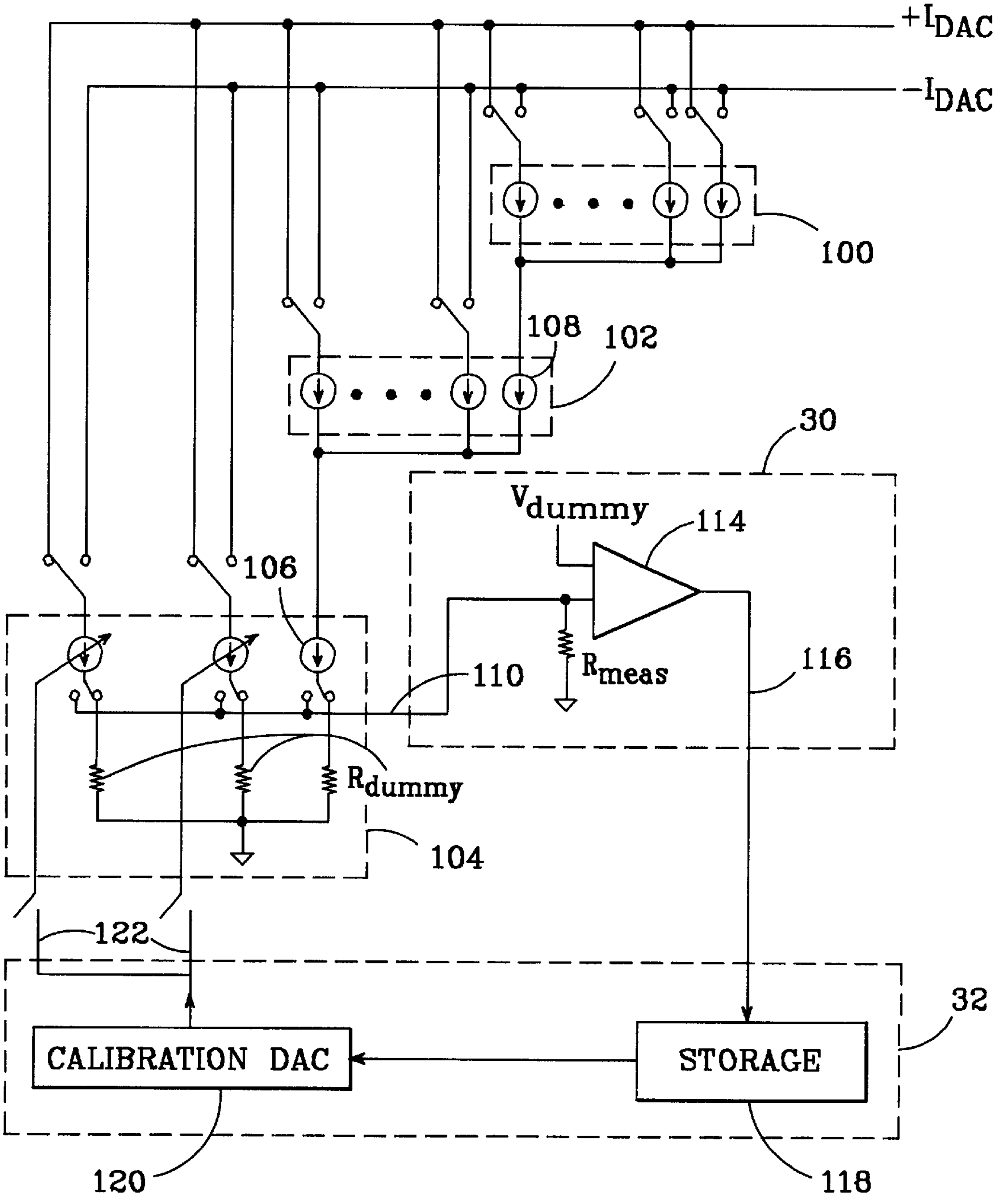
FIG. 4 is a schematic diagram of a switched current source DAC employing self-trimming current sources per the present invention.

The present invention is advantageously employed in a switched current source DAC such as that depicted in FIG. 4, which is provided as but one example of the present invention's applicability. The DAC is segmented into LLSBs, ULSBs, and MSBs. Each segment is implemented with a respective subarray of current sources: the LLSBs with current source subarray 100, the ULSBs with subarray 102, and the MSBs with a subarray of self-trimming current sources 104. In this architecture, a fixed MSB current source 106 is used to drive the ULSB subarray, and ULSB current source 108 is used to drive the LLSB subarray.

An exemplary measurement circuit 30 receives the switched calibration outputs from each of the MSB current sources at an input 110, which is connected to measurement resistor $R_{meas}$. A circuit 114, suitably implemented with a delta sigma modulator or other high accuracy voltage measurement circuit, receives a dummy voltage $V_{dummy}$ and the voltage across $R_{meas}$ at respective inputs, and provides an output 116 which varies with the difference between its two inputs. An exemplary correction circuit 32 receives output 116 and stores the difference value in a storage device 118. The output of storage device 118 is connected to a calibration DAC 120, which provides respective control signals 122 to the variable current sources within the self-trimming current sources of subarray 104.

In this exemplary DAC, two cycles are continuously occurring: a measurement cycle and a correction cycle. A measurement is first made of the difference of the sum of the ULSBs, which acts as a reference voltage $V_{ref}$, and the dummy voltage $V_{dummy}$. The goal of the self-trimming process is to adjust the self-trimming current sources such that the output of each is made equal to $V_{ref}$. During the remainder of the measurement cycle, the output of each current source is connected to correction circuit 30 in turn, its difference with $V_{dummy}$ determined, and the difference value then subtracted from the difference of $V_{ref}$ and $V_{dummy}$ already determined. The $V_{dummy}$ value cancels out, leaving the difference of the self-trimming current source output and $V_{ref}$. This difference value is stored. In this way, both the ULSB sum and the self-trimming current sources are measured on the same input of the correction circuit 30, avoiding any offsets in the latter. During the correction cycle, the stored difference values are used by the calibration DAC to produce the control signals 122 needed to calibrate the self-trimming current sources. A measurement cycle and a correction cycle occur during each of the DAC's conversion cycles, so that the MSB values are continuously compensated for such factors as temperature and aging drift.

The DAC shown in FIG. 4 is provided for illustrative purposes only; the DAC's architecture and the details of circuits 30 and 32 may differ widely from application to application. To reduce the number of components, the inputs to measurement circuit 30 and the outputs of calibration DAC 120 are preferably multiplexed, as shown in FIG. 4. However, multiplexing in this way is not essential to the invention. For example, individual, dedicated calibration DACs could be employed to provide control signals to respective self-trimming current sources, which would eliminate the need to provide switches and storage capacitors on the variable current source input lines.

While particular embodiments of the invention have been shown and described, numerous variations and alternate embodiments will occur to those skilled in the art. Accordingly, it is intended that the invention be limited only in terms of the appended claims.

We claim:

1. A self-trimming current source for a switched current source digital-to-analog converter (DAC), comprising:

a fixed current source, comprising:

a first field-effect transistor (FET) having its gate connected to a first bias voltage, its source connected to a first junction, and its drain providing the output of said self-trimming current source, said first FET saturated by said first bias voltage such that a known voltage is established at said first junction, a second FET complementary to said first FET, having its gate connected to a second bias voltage and its source connected to said first junction such that said known voltage establishes said second FET's gate-source voltage and thereby a first output current at said output, the drain terminals of said first and second FETs each providing a high impedance to the respective circuits to which they are connected, a variable current source connected to provide a current to said first junction and thereby a second output current at said output in response to a control signal received at an input, the total output current of said self-trimming current source being the sum of said first and second output currents, a first switch responsive to a calibrate signal which connects the drain of said second FET to a measurement circuit when said calibrate signal is in a first state and to a circuit common point when said calibrate signal is in a second state, a measurement circuit which produces an output representative of the magnitude of said total output current when said calibrate signal is in said first state, and a correction circuit which receives said current measurement circuit output at an input and provides said control signal to said variable current source at an output, said correction circuit arranged to vary said control signal such that said total output current is made equal to a predetermined value within a predetermined tolerance, said self-trimming current source being one of a plurality of current sources making up a switched current source DAC.

2. The self-trimming current source of claim 1, wherein said first FET is an n-channel FET, said second FET is a p-channel FET which is saturated by said second bias voltage, and said first and second output currents are sunk by said fixed and variable current sources, respectively, such that said total output current is sunk by said self-trimming current source.

3. The self-trimming current source of claim 2, further comprising a bias circuit which provides said second bias voltage to second FET, said bias circuit comprising:

a current source arranged to sink a current equal to the desired value of said first output current, an NMOS device having its gate connected to receive said first bias voltage and a diode-connected PMOS device connected in series between a positive supply voltage and said current source such that each device carries said sunk current and said NMOS device sets the gate voltage of said PMOS device equal to said first bias voltage minus the sum of the gate-source voltages of said NMOS and PMOS devices, the gate of said PMOS device providing said second bias voltage.

4. The self-trimming current source of claim 1, wherein said first FET is a p-channel FET, said second FET is an n-channel FET, said second bias voltage is a positive voltage greater than said first fixed voltage which saturates said second FET, and said first and second output currents are sourced by said fixed and variable current sources, respectively, such that said total output current is sourced by said self-trimming current source.

5. The self-trimming current source of claim 1, wherein said variable current source comprises:

a third FET having its gate connected to receive said control signal and its drain connected to said first junction, a fourth FET having its gate and drain connected to the gate and drain of said second FET, respectively, and its source connected to the source of said third FET, said third FET operated in linear mode such that the current provided to said first junction by said variable current source varies with the voltage of said control signal.

6. The self-trimming current source of claim 5, wherein said third FET is an n-channel FET and said fourth FET is a p-channel FET.

7. The self-trimming current source of claim 5, wherein said third FET is a p-channel FET and said fourth FET is an n-channel FET.

8. The self-trimming current source of claim 1, further comprising a storage capacitor connected between said variable current source input and said circuit common point and a second switch connected between said variable current source input and said control signal such that the voltage of said control signal is stored on said capacitor when said second switch is closed and thereby remains applied to said variable current source when said second switch opens after being closed.

9. The self-trimming current source of claim 8, further comprising a controller arranged to periodically close said first switch such that said measurement circuit produces said output representative of the magnitude of said total output current and to periodically close said second switch to store the output of said correction circuit on said storage capacitor.

10. The self-trimming current source of claim 1, wherein said correction circuit includes a calibration DAC which continuously provides said control signal to said variable current source input.

11. The self-trimming current source of claim 1, further comprising a bias circuit which provides said first bias voltage to said first FET, said bias circuit comprising:

a first p-channel FET having its source connected to a positive supply voltage and its gate connected to a third bias voltage, a second p-channel FET having its source connected to the drain of said first p-channel FET and its gate connected to a fourth bias voltage, and an n-channel FET having its drain connected to the drain of said second p-channel FET at a second junction, its gate connected to said first junction, and its source connected to said circuit common point, said second junction connected to the gate of said first FET and providing said first bias voltage, said first FET and said n-channel FET forming a feedback loop which holds the source voltage of said second FET about constant at the gate-source voltage of said n-channel FET.

12. The self-trimming current source of claim 11, further comprising a bias voltage generating circuit which provides said third bias voltage to said bias circuit, said bias voltage generating circuit comprising:

a dummy current source comprising a second fixed current source arranged per said fixed current source and a second bias circuit arranged per said bias circuit, said second bias circuit providing said first bias voltage to said first FET of said second fixed current source, a load resistor connected to carry the current sunk by said dummy current source, and an operational amplifier connected to receive a setpoint voltage at a first input and a signal representative of the current flowing through said load resistor at its second input, said amplifier's output providing said third bias voltage to said bias circuit and to said dummy current source, said dummy current source, load resistor, and amplifier forming a control loop which keeps the value of said third bias voltage constant with respect to said setpoint voltage.

13. The self-trimming current source of claim 1, further comprising a bias circuit which provides said first bias voltage to said first FET, said bias circuit comprising:

a first n-channel FET having its source connected to said circuit common point and its gate connected to a third bias voltage, a second n-channel FET having its source connected to the drain of said first n-channel FET and its gate connected to a fourth bias voltage, and a p-channel FET having its drain connected to the drain of said second n-channel FET at a second junction, its gate connected to said first junction, and its source connected to a positive supply voltage, said second junction connected to the gate of said first FET and providing said first bias voltage, said first FET and said p-channel FET forming a feedback loop which holds the source voltage of said second FET about constant at the gate-source voltage of said p-channel FET.

14. The self-trimming current source of claim 1, wherein said first switch comprises first and second switching transistors, the drain-source circuit of said first switching transistor connected between the drain of said second FET and the measurement circuit at a second junction, the drain-source circuit of said second switching transistor connected between the drain of said second FET and said circuit common point, the respective gates of said first and second switching transistors connected to receive complementary forms of said calibrate signal such that the drain of said second FET is connected to said measurement circuit when said calibrate signal is in said first state and to said circuit common point when said calibrate signal is in said second state.

15. The self-trimming current source of claim 14, further comprising a measurement resistor connected between said second junction and said circuit common point which develops a voltage across it that varies with said total output current.

16. The self-trimming current source of claim 15, further comprising a dummy resistor connected between the source of said second switching transistor and said circuit common point, the resistance of said dummy resistor being equal to that of said measurement resistor within a known tolerance.

17. The self-trimming current source of claim 1, further comprising third and fourth switching transistors having their respective current circuits connected to said output of said self-trimming current source at one end and providing differential outputs for said self-trimming current source at their other end, said third and fourth switching transistors' respective control inputs connected to complementary control signals and conducting said total output current to one or the other of said differential outputs in response to said complementary control signals.

18. A self-trimming current source for a switched current source digital-to-analog converter (DAC), comprising:

a fixed current source, comprising:

a first n-channel field-effect transistor (FET) having its gate connected to a first bias voltage, its source connected to a first junction, and its drain providing the output of said self-trimming current source, a first p-channel FET having its gate connected to a circuit common point and its source connected to said first junction, the drain terminals of said first n-channel and first p-channel FETs each providing a high impedance to the respective circuits to which they are connected, a bias circuit which provides said first bias voltage to said first n-channel FET, said bias circuit comprising:

a second p-channel FET having its source connected to a positive supply voltage and its gate connected to a second bias voltage, a third p-channel FET having its source connected to the drain of said second p-channel FET and its gate connected to a third bias voltage, and a second n-channel FET having its drain connected to the drain of said third p-channel FET at a second junction, its gate connected to said first junction, and its source connected to said circuit common point, said second junction connected to the gate of said first n-channel FET and providing said first bias voltage, said first and second n-channel FETs forming a feedback loop which holds the source voltage of said first p-channel FET about constant at the gate-source voltage of said second n-channel FET, a variable current source connected to provide a current to said first junction and thereby a second output current at said output in response to a control signal received at an input, the total output current of said self-trimming current source being the sum of said first and second output currents, said variable current source comprising:

a third n-channel FET having its gate connected to receive said control signal and its drain connected to said first junction, a fourth p-channel FET having its gate and drain connected to the gate and drain of said first p-channel FET, respectively, and its source connected to the source of said third n-channel FET, said third n-channel FET operated in linear mode such that the current provided to said first junction by said variable current source varies with the voltage of said control signal, first and second switching transistors, the drain-source circuits of which are connected between the drain of said first p-channel FET and dummy and measurement resistors, respectively, the others ends of said dummy and measurement resistors connected to said circuit common point, the gates of said switching transistors receiving complementary forms of a calibrate signal such that the drain of said first p-channel FET is connected to said measurement resistor when said calibrate signal is in a first state and to said dummy resistor when said calibrate signal is in a second state, a measurement circuit connected to the junction between said second switching transistor and said measurement resistor which produces an output representative of the magnitude of said total output current when said calibrate signal is in said first state, and a correction circuit which receives said measurement circuit output at an input and provides said control signal to said variable current source at an output, said correction circuit arranged to vary said control signal such that said total output current is made equal to a predetermined value within a predetermined tolerance, said self-trimming current source being one of a plurality of current sources making up a switched current source DAC.

19. The self-trimming current source of claim 18, further comprising a pair of transistors having their respective current circuits connected to said output of said self-trimming current source at one end and providing differential outputs for said self-trimming current source at their other end, their respective control inputs connected to complementary control signals and conducting said total output current to one or the other of said differential outputs in response to said complementary control signals.

20. The self-trimming current source of claim 18, further comprising a storage capacitor connected between said variable current source input and said circuit common point and a switch connected between said variable current source input and said control signal such that the voltage of said control signal is stored on said capacitor when said switch is closed and thereby remains applied to said variable current source when said switch opens after being closed.

21. The self-trimming current source of claim 20, further comprising a controller arranged to periodically drive said calibrate signal into said first state such that said measurement circuit produces said output representative of the magnitude of said total output current and to periodically close said switch to store the output of said correction circuit on said storage capacitor.

22. The self-trimming current source of claim 18, wherein said correction circuit includes a calibration DAC which continuously provides said control signal to said variable current source input.

23. A self-trimming current source for a switched current source digital-to-analog converter (DAC), comprising:

a fixed current source, comprising:

a first p-channel field-effect transistor (FET) having its gate connected to a first bias voltage, its source connected to a first junction, and its drain providing the output of said self-trimming current source, a first n-channel FET having its gate connected to a positive supply voltage and its source connected to said first junction, the drain terminals of said first p-channel and first n-channel FETs each providing a high impedance to the respective circuits to which they are connected, a bias circuit which provides said first bias voltage to said first n-channel FET, said bias circuit comprising:

a second n-channel FET having its source connected to a circuit common point and its gate connected to a second bias voltage, a third n-channel FET having its source connected to the drain of said second n-channel FET and its gate connected to a third bias voltage, and a second p-channel FET having its drain connected to the drain of said third n-channel FET at a second junction, its gate connected to said first junction, and its source connected to said positive supply voltage, said second junction connected to the gate of said first p-channel FET and providing said first bias voltage, said first and second p-channel FETs forming a feedback loop which holds the source voltage of said first n-channel FET about constant at the gate-source voltage of said second p-channel FET, a variable current source connected to provide a current to said first junction and thereby a second output current at said output in response to a control signal received at an input, the total output current of said self-trimming current source being the sum of said first and second output currents, said variable current source comprising:

a third p-channel FET having its gate connected to receive said control signal and its drain connected to said first junction, a fourth n-channel FET having its gate and drain connected to the gate and drain of said first n-channel FET, respectively, and its source connected to the source of said third p-channel FET, said third p-channel FET operated in linear mode such that the current provided to said first junction by said variable current source varies with the voltage of said control signal, first and second switching transistors, the drain-source circuits of which are connected between the drain of said first n-channel FET and dummy and measurement resistors, respectively, the others ends of said dummy and measurement resistors connected to said circuit common point, the gates of said switching transistors receiving complementary forms of a calibrate signal such that the drain of said first n-channel FET is connected to said measurement resistor when said calibrate signal is in a first state and to said dummy resistor when said calibrate signal is in a second state, a measurement circuit connected to the junction between said second switching transistor and said measurement resistor which produces an output representative of the magnitude of said total output current when said calibrate signal is in said first state, and a correction circuit which receives said current measurement circuit output at an input and provides said control signal to said variable current source at an output, said correction circuit arranged to vary said control signal such that said total output current is made equal to a predetermined value within a predetermined tolerance, said self-trimming current source being one of a plurality of current sources making up a switched current source DAC.

24. A switched current source digital-to-analog converter (DAC), comprising:

an array of current sources which produce respective output currents, an array of switches which are connected to switch respective ones of said current source outputs to a DAC output line in response to respective control signals to provide an output current on said output line, and a controller which receives a digital input word representing a desired output current and which provides said control signals to said switches to produce said desired output current, a plurality of said current sources being self-trimming current sources, each of said self-trimming current sources comprising:

a fixed current source, comprising:

a first field-effect transistor (FET) having its gate connected to a first bias voltage, its source connected to a first junction, and its drain providing the output of said self-trimming current source, said first FET saturated by said first bias voltage such that a known voltage is established at said first junction, a second FET complementary to said first FET, having its gate connected to a second bias voltage and its source connected to said first junction such that said known voltage establishes said second FET's gate-source voltage and thereby a first output current at said output, the drain terminals of said first and second FETs each providing a high impedance to the respective circuits to which they are connected, a variable current source connected to provide a current to said first junction and thereby a second output current at said output in response to a control signal received at an input, the total output current of said self-trimming current source being the sum of said first and second output currents, a switch which is connected to the drain of said second FET at an input, to a measurement circuit at a first output, and to said circuit common point at a second output, said switch responsive to a calibrate signal such that it provides a conductive path between its input and said first output when said calibrate signal is in a first state, and a conductive path between its input and said second output when said calibrate signal is in a second state, a measurement circuit which produces an output representative of the magnitude of said total output current when said calibrate signal is in said first state, and a correction circuit which receives said current measurement circuit output at an input and provides said control signal to said variable current source at an output, said correction circuit arranged to vary said control signal such that said total output current is made equal to a predetermined value within a predetermined tolerance.

25. The switched current source DAC of claim 24, wherein said measurement circuit comprises:

a node which is connected to the first outputs of each of said switches, a measurement resistor connected between said node and said circuit common point, and a voltage measurement circuit which determines the voltage across said measurement resistor.

26. The switched current source DAC of claim 25, wherein said voltage measurement circuit comprises a delta sigma modulator.

27. The switched current source DAC of claim 24, wherein said correction circuit comprises:

storage means for storing the outputs of said measurement circuit produced for each of said self-trimming current sources, and at least one calibration DAC connected to said storage means and arranged to provide said control signals to respective self-trimming current sources, the control signal provided to each self-trimming current source varying with the stored output produced by said measurement circuit for said self-trimming current source.

28. The switched current source DAC of claim 27, wherein said at least one calibration DAC comprises respective calibration DACs for each of said self-trimming current sources, said calibration DACs continuously providing respective control signals to their respective self-trimming current sources.

29. The switched current source DAC of claim 27, further comprising a plurality of storage capacitors connected between respective variable current source inputs and said circuit common point and a plurality of switches connected in series with said variable current source inputs such that the voltage of the control signal received by each self-trimming current source is stored on said capacitor when said series switch is closed and thereby remains applied to said variable current source when said switch opens after being closed, said at least one calibration DAC comprising one calibration DAC arranged to provide said control signals to respective self-trimming current sources in turn when their corresponding series switches are closed.

30. A method of automatically trimming the output current of a self-trimming current source which is part of a switched current source digital-to-analog converter (DAC), comprising the steps of:

providing a fixed output current, providing a variable output current, the total output current of said self-trimming current source being the sum of said fixed and variable output currents, measuring said total output current, adjusting said variable output current such that said total output current equals a predetermined value within a predetermined tolerance.

31. The method of claim 30, wherein said DAC has an associated conversion cycle during which it converts a digital input word to an analog output value, said measuring and adjusting steps being performed once per conversion cycle.

32. A method of automatically trimming the output currents of a plurality of self-trimming current sources which are part of a switched current source digital-to-analog converter (DAC), said self-trimming current sources trimmed by:

providing respective fixed output currents, providing respective variable output currents, the respective total output currents of said self-trimming current sources being the sum of their respective fixed and variable output currents, measuring the total output currents of each of said self-trimming current sources in turn, adjusting the variable output currents of each of said self-trimming current sources in turn such that each of their total output currents are made equal to a predetermined value within a predetermined tolerance.

33. The method of claim 32, wherein said DAC has an associated conversion cycle during which it converts a digital input word to an analog output value, said measuring and adjusting steps being performed once per conversion cycle.

34. The method of claim 32, further comprising the steps of storing the measured total output current values and adjusting the variable output currents of each of said self-trimming current sources in turn based on said stored values.

* * * * *